(12) United States Patent
Kim et al.

(10) Patent No.: US 7,009,257 B2
(45) Date of Patent: Mar. 7, 2006

(54) METHODS OF MANUFACTURING INTEGRATED CIRCUIT DEVICES HAVING REDUCED CONTACT RESISTANCE BETWEEN A SUBSTRATE AND A CONTACT PAD WHILE MAINTAINING SEPARATION OF THE SUBSTRATE AND THE CONTACT PAD AND INTEGRATED CIRCUIT DEVICES FORMED THEREBY

(75) Inventors: Young-pil Kim, Kyungki-do (KR); Beom-jun Jin, Seoul (KR); Hyoung-joon Kim, Seoul (KR); Byeong-yun Nam, Kyungki-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/741,751

(22) Filed: Dec. 19, 2003

(65) Prior Publication Data
US 2004/0129981 A1 Jul. 8, 2004

Related U.S. Application Data

(62) Division of application No. 10/038,967, filed on Jan. 4, 2002, now Pat. No. 6,689,654.

(30) Foreign Application Priority Data
Jan. 6, 2001 (KR) .................................. 2001-845

(51) Int. Cl.
*H01L 29/72* (2006.01)
(52) U.S. Cl. ...................... 257/368; 257/369; 257/371; 257/372

(58) Field of Classification Search ................ 257/368, 257/369, 371, 372
See application file for complete search history.

(56) References Cited

U.S. PATENT DOCUMENTS

| | | | |
|---|---|---|---|
| 5,702,986 A | 12/1997 | Matthews et al. | 438/163 |
| 5,716,861 A | 2/1998 | Moslehi | 438/231 |
| 6,017,823 A * | 1/2000 | Shishiguchi et al. | 438/696 |
| 6,329,225 B1 | 12/2001 | Rodder | 257/336 |
| 6,365,451 B1 | 4/2002 | Havemann | 438/230 |

FOREIGN PATENT DOCUMENTS

| | | |
|---|---|---|
| JP | 3292739 | 12/1991 |
| JP | 7183486 | 7/1995 |

* cited by examiner

*Primary Examiner*—Edward Wojciechowicz
(74) *Attorney, Agent, or Firm*—Myers Bigel Sibley & Sajovec, P.A.

(57) ABSTRACT

An integrated circuit device includes a substrate that has a source region and a drain region formed therein. A gate pattern is disposed on the substrate between the source region and the drain region. A lower pad layer is disposed on the source region and/or the drain region and comprises a same crystalline structure as the substrate. A conductive layer is disposed on the lower pad layer such that at least a portion of the conductive layer is disposed between the lower pad layer and the gate pattern. An insulating layer is disposed between the gate pattern and both the lower pad layer and the conductive layer, and also between the conductive layer and the substrate.

12 Claims, 7 Drawing Sheets

METHODS OF MANUFACTURING INTEGRATED CIRCUIT DEVICES HAVING REDUCED CONTACT RESISTANCE BETWEEN A SUBSTRATE AND A CONTACT PAD WHILE MAINTAINING SEPARATION OF THE SUBSTRATE AND THE CONTACT PAD AND INTEGRATED CIRCUIT DEVICES FORMED THEREBY

RELATED APPLICATION

This application is a divisional of application Ser. No. 10/038,967 filed on Jan. 4, 2002, U.S. Pat. No. 6,689,654 entitled "METHODS OF MANUFACTURING INTEGRATED CIRCUIT DEVICES HAVING REDUCED CONTACT RESISTANCE BETWEEN A SUBSTRATE AND A CONTACT PAD WHILE MAINTAINING SEPARATION OF THE SUBSTRATE AND THE CONTACT PAD," which claims priority from Korean Application No. 2001-845, filed Jan. 6, 2001, the disclosures of which are incorporated by reference herein in their entireties.

FIELD OF THE INVENTION

The present invention relates generally to integrated circuit devices and manufacturing methods therefor and, more particularly, to contact structures that may connect an integrated circuit substrate to an upper conductive layer and methods of forming same.

BACKGROUND OF THE INVENTION

An integrated circuit device may be formed by depositing one or more conductive layers having a predetermined pattern and one or more insulating layers on a substrate. For example, transistors having a gate, a source region, and a drain region may be formed in active regions of the substrate, and the source/drain regions may be electrically connected to an upper conductive layer, such as a bit line or a lower electrode of a capacitor, through a contact structure.

A method of forming a conventional self-aligned contact structure will be described with reference to FIG. 1. In FIG. 1, a gate pattern 16, which comprises a gate insulating layer 12, a gate electrode 13, a capping layer 14, a pair of spacers 15, and a source/drain region 11 are formed on a substrate 10. An interlayer insulating layer 17 is then formed, which covers the gate pattern 16. Next, the interlayer insulating layer 17 is etched in a self-aligned manner to form a contact hole 18. The contact hole 18 is filled with a conductive material to form a contact pad 19, and then an upper conductive layer (not shown) having a predetermined pattern is formed on the contact pad 19 and the interlayer insulating layer 17 to form a self-aligned substrate contact structure. The capping layer 14 and the spacers 15 may protect the gate electrode 13 when the interlayer insulating layer 17 is etched to form the contact hole 18.

The self-alignment process may enable formation of a contact in increasingly more highly integrated devices, which may use a narrow area for the contact, and may also ensure a sufficient alignment margin for a photolithographic process. As the integration density of integrated circuit devices continues to increase, however, contact resistance may be problematic. As integration density increases, contact resistance generally increases due to the resistance of polycrystalline silicon and the decreased contact area between a contact pad and a source/drain region. The increase in contact resistance may lower the operational speed and/or hinder the integration of an integrated circuit device.

Several techniques have been used to reduce contact resistance, including: 1) the concentration of impurities used in a process for doping polycrystalline silicon may be increased, 2) the contact pad maybe formed of metal, and/or 3) the contact area between a contact pad and a source/drain region may be increased. The first and second techniques may result in impurities or metal diffusing into a source/drain region so that the electrical property of a device may be changed. The third technique may involve increasing the area of a contact hole for the purpose of increasing the contact surface area between a contact pad and a source/drain region. This approach, however, may not be compatible with increasing integration density.

FIGS. 2A and 2B illustrate integrated circuit devices comprising a substrate, 20, a device isolation layer 21, a gate insulating layer 23, a gate electrode 24, an interlayer insulating layer 25, and a contact hole 26. Silicon layers 27 and 27' having the same conductivity type as a source/drain region 22 are formed in a particular area exposed by a contact hole 26 belonging to the source/drain region 22, thereby increasing the contact area between an upper conductive layer 28 and the source/drain region 22. Unfortunately, the upper conductive layer 28 is in direct contact with the source/drain region 22 at the edge of each of the silicon layers 27 and 27'. As a result, impurities or metal from the upper conductive layer 28 may diffuse into the source/drain region 22.

SUMMARY OF THE INVENTION

According to embodiments of the present invention, an integrated circuit device comprises a substrate that has a source region and a drain region formed therein. A gate pattern is disposed on the substrate between the source region and the drain region. A lower pad layer is disposed on the source region and/or the drain region and comprises a same crystalline structure as the substrate. A conductive layer is disposed on the lower pad layer such that at least a portion of the conductive layer is disposed between the lower pad layer and the gate pattern. An insulating layer is disposed between the gate pattern and both the lower pad layer and the conductive layer, and also between the conductive layer and the substrate.

In other embodiments, the insulating layer extends on to at least a portion of the source region or the drain region.

In still other embodiments, the lower pad layer has a recessed region in an upper surface thereof, opposite the substrate.

In further embodiments, an interlayer insulating layer is disposed on at least a portion of the gate pattern adjacent the conductive layer.

In still further embodiments, the insulating layer comprises silicon nitride (SiN), and the conductive layer comprises impurity doped polycrystalline silicon, titanium nitride (TiN), and/or tungsten (W).

The present invention may also be embodied as methods of manufacturing integrated circuit devices.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
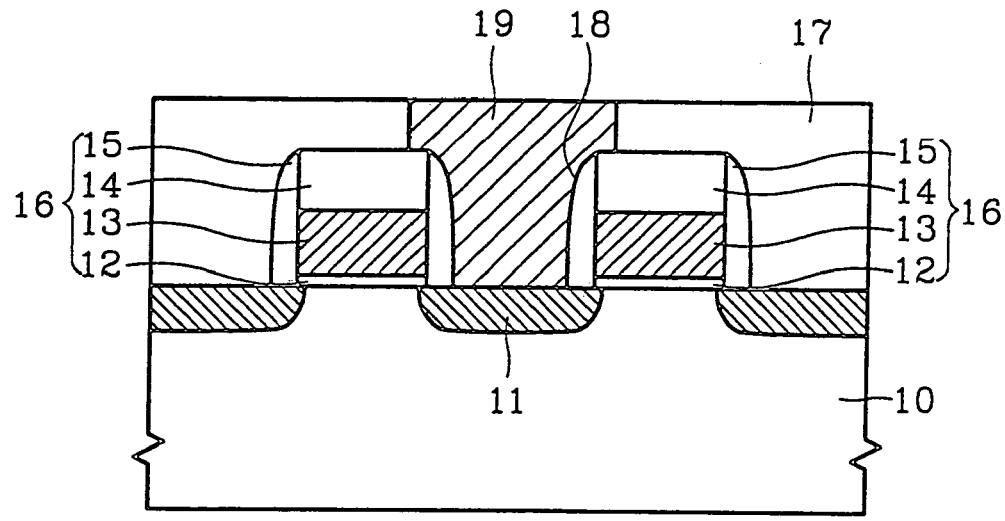
FIG. 1 illustrates a method of forming a self-aligned contact structure.
Figure 2A:
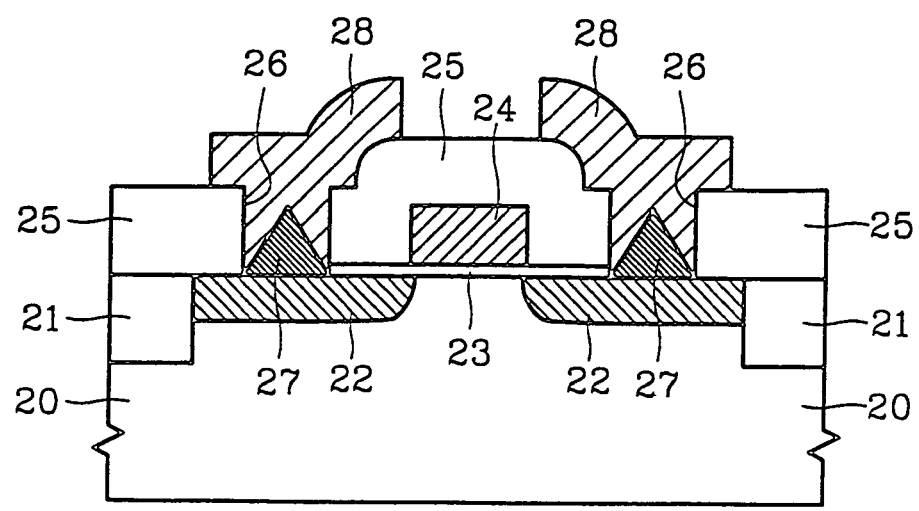
FIGS. 2A and 2B illustrate conventional integrated circuit contact structures.
Figure 2B:
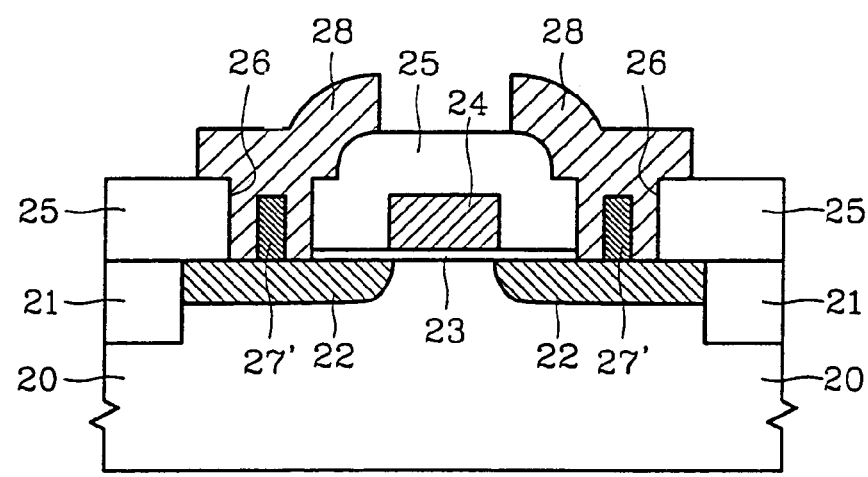

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. It will also be understood that when an element, such as a layer, region, or substrate, is referred to as being "on" another element, it can be directly on the other element or intervening elements may be present. In contrast, when an element, such as a layer, region, or substrate, is referred to as being "directly on" another element, there are no intervening elements present.

Figure 3A:
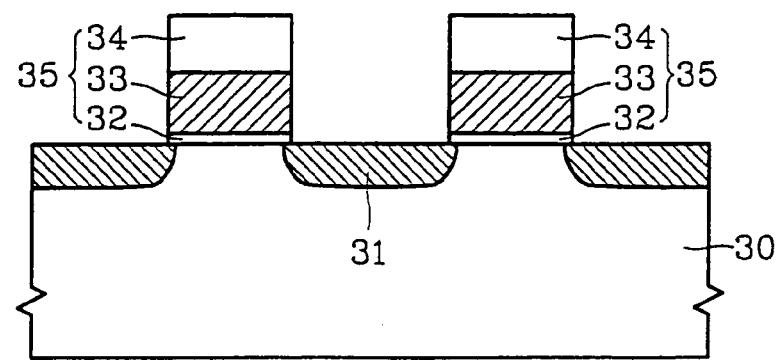
FIGS. 3–5 illustrate methods of forming integrated circuit device contact structures in accordance with various embodiments of the present invention.

FIGS. 3A through 3E illustrate methods of forming a contact structure, in accordance with embodiments of the present invention, and contact structures formed thereby. Referring to FIG. 3A, a gate pattern 35, comprising a gate insulating layer 32, a gate electrode 33, and a capping layer 34, is formed on a substrate 30. Ions are then implanted into the substrate 30 using the gate pattern 35 as a mask to form a source/drain region 31. The gate electrode 33 may comprise impurity-doped polycrystalline silicon. In other embodiments, the gate electrode 33 may comprise impurity-doped polycrystalline silicon and metal silicide. When used in a non-volatile memory such as a flash memory, the gate electrode 33 may comprise a floating gate, a middle insulating layer, and a control gate. The capping layer 34 may comprise a silicon nitride layer and may be used to protect the gate electrode 33 when forming a self-aligned contact hole. In other embodiments in which a self-aligned contact hole is not formed, the capping layer 55 may be omitted from the structure. In other embodiments, sidewall spacers (not shown) may be formed at both sidewalls of the gate pattern 35 to protect the gate electrode when forming a self-aligned contact hole. In addition, the sidewall spacers may be used as an ion injection mask in forming a source/drain region having a lightly-doped drain structure.

Figure 3B:
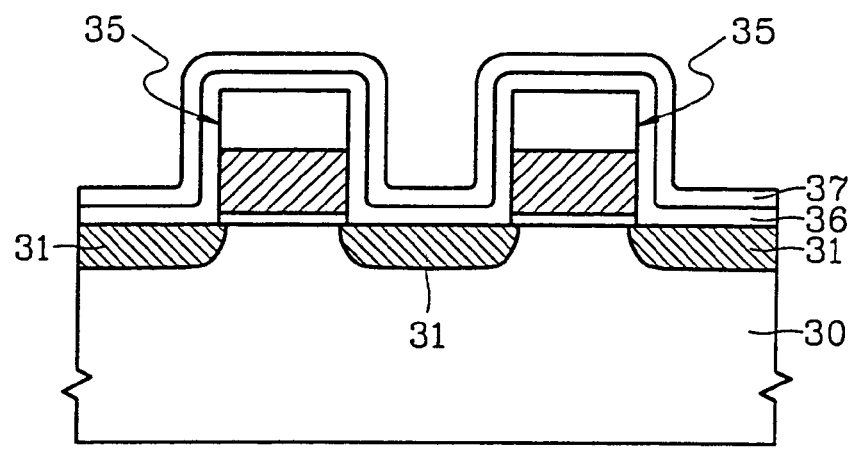

Referring now to FIG. 3B, first and second insulating layers 36 and 37 are sequentially formed on the structure of FIG. 3A. Specifically, the first insulating layer 36 is formed by depositing a silicon nitride layer (SiN) on the substrate 30 and the gate pattern 35 using chemical vapor deposition (CVD). The second insulating layer 37 is then formed by depositing a silicon oxide layer on the first insulating layer 36. After formation of the first insulating layer 36, sidewall spacers may be formed at the sidewalls of the gate pattern 35 by anisotropic etching. In some embodiments, however, the second insulating layer 37 is formed without first etching the first insulating layer 36. The second insulating layer 37 is used to form spacers 37' of FIG. 3C, which act as a growth mask for an epitaxially-grown lower pad layer 38 of FIG. 3D. The spacers 37' may then be removed separately from the first insulating layer 36, e.g., the second insulating layer 37 may comprise a material having an etching selectivity with respect to the first insulating layer 36.

Figure 3C:
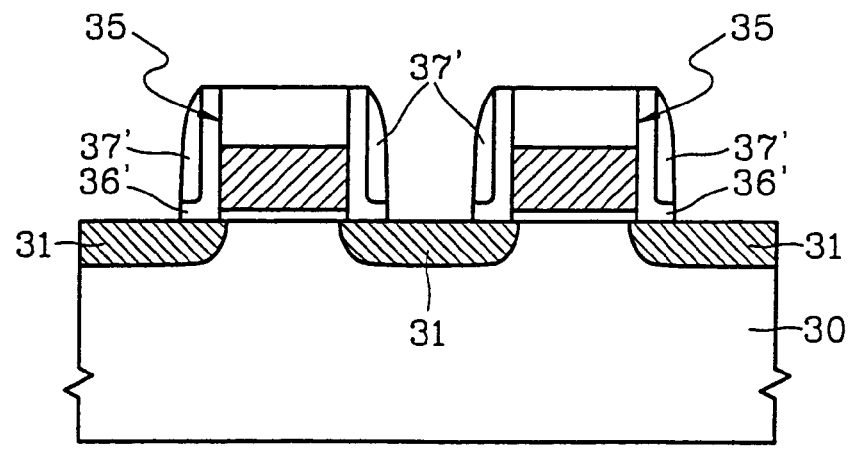

Referring now to FIG. 3C, the second insulating layer 37 is anisotropically etched to form the spacers 37'. The first insulating layer 36 is then etched using the spacers 37' as a mask. The source/drain region 31 is exposed and most of the first insulating layer 36 is removed, thereby nearly exposing the capping layer 34 of the gate pattern 35. As a result, the first insulating layer 36' has a similar form as conventional sidewall spacers formed at the sidewalls of a gate pattern. Unlike conventional sidewall spacers, however, the first insulating layer 36' has a bottom portion that extends over the substrate 30 beneath each of the spacers 37'. The extended portions of the first insulating layer 36' may prevent an upper conductive layer, which will be subsequently formed, from directly contacting the source/drain region 31. As a result, the first insulating layer 36' left at the sidewalls of the gate pattern 35 and the capping layer 34 covers the gate electrode 33 and may act as a protector for the gate electrode 33.

Figure 3D:
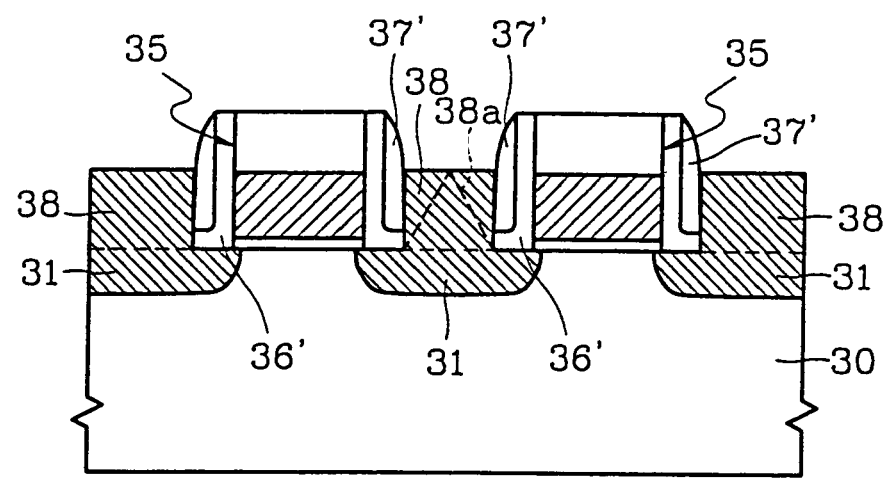

Referring now to FIG. 3D, a lower pad layer 38 is selectively and epitaxially grown to a predetermined height on the substrate 30 in the exposed source/drain region 31. The substrate 30 may comprise monocrystalline silicon. Thus, the lower pad layer 38 may comprise monocrystalline silicon and is self aligned by the spacers 37'. Due to the characteristics of an epitaxial grown material, the lower pad layer 38 has the same crystalline structure as that of the substrate 30. This may eliminate a boundary surface at which contact resistance may exist between the exposed source/drain region 31 and the lower pad layer 38. Accordingly, the formation of the lower pad layer 38 may not increase contact resistance.

Figure 3E:
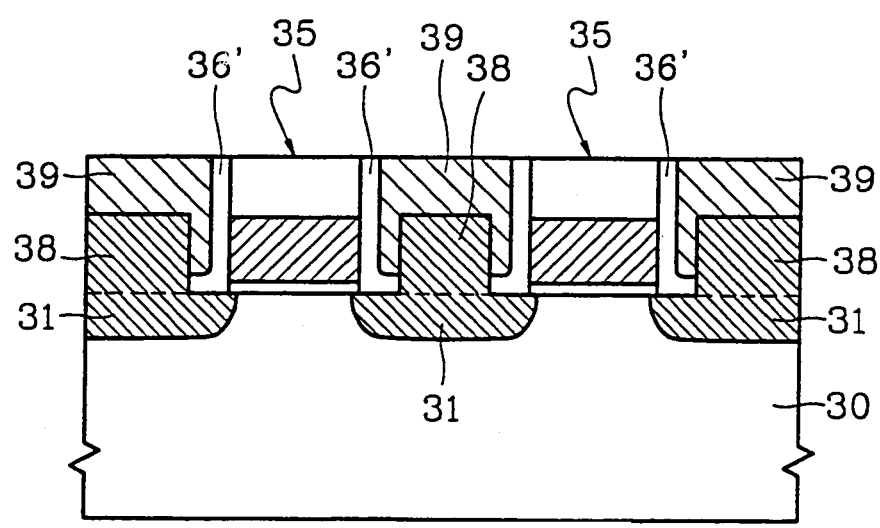

Next, the spacers 37' are removed using, for example, dry or wet etching, and an upper conductive layer 39 is formed by filling the space defined by the first insulating layer 36' and the lower pad layer 38 with a conductive material. The resultant structure is illustrated in FIG. 3E. In more detail, the spacers 37' are removed and the space is filled by depositing impurity-doped polycrystalline silicon or a metal having a low resistance, such as TiN or W. The resultant structure may then be planarized by performing a chemical/mechanical polishing process. As shown in FIG. 3E, the upper conductive layer 39 may be a contact pad (the upper conductive layer may be called an upper pad layer when the upper conductive layer 39 is planarized), which engages the lower pad layer 38. If the upper conductive layer 39 comprises a metal, such as TiN or W, then in some embodiments a barrier layer (not shown) comprising a Ti layer or a deposited layer consisting of a TiN layer and a Ti layer is interposed between the lower pad layer 38 and the upper conductive layer 39.

Next, an upper interconnection layer (not shown) may be formed, which comprises a metal, such as Al or W, metal silicide, or polycrystalline silicon, to thereby complete the formation of a contact structure. In some embodiments, the upper interconnection layer (not shown) is formed by depositing a conductive material and then patterning. The upper interconnection layer may be formed, however, by patterning without planarizing the upper conductive layer 39. That is, the upper conductive layer 39 may act as both a contact pad and an upper interconnection layer.

Still referring to FIG. 3E, according to embodiments of the present invention, the upper conductive layer 39 contacts the lower pad layer on both an upper surface and a sidewall, thereby reducing the contact resistance. In addition, the bottom portion of the first insulating layer 36' extends over the surface of the exposed source/drain region 31 beneath the spacers 37', thereby preventing the upper conductive layer 39 from directly contacting the source/drain region 31. As a result, even if the upper conductive layer 39 comprises a metal or polycrystalline silicon doped with a high concentration of impurities, the diffusion of metal or impurities into the source/drain region 31 may be reduced.

Figure 4A:
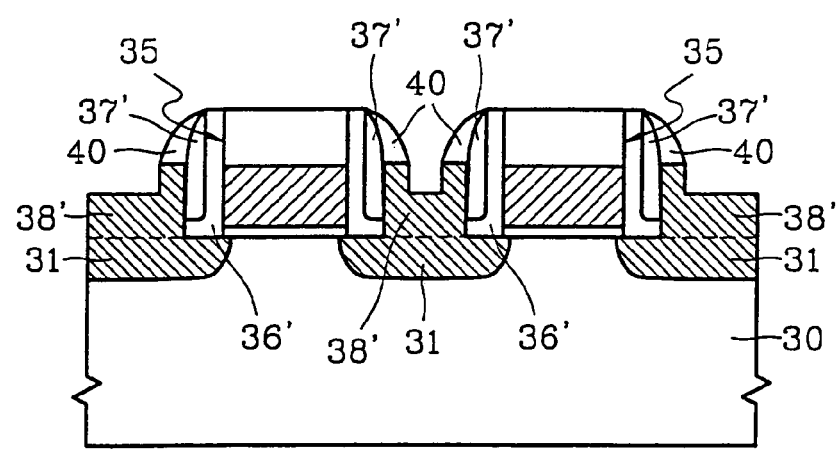
Figure 4B:
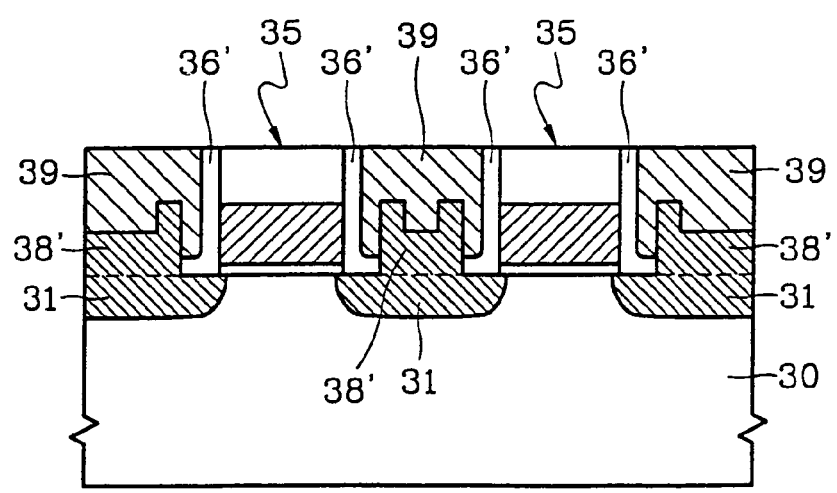

FIGS. 4A and 4B are cross-sectional views that illustrate methods of forming a contact structure in accordance with other embodiments of the present invention. A third insulating layer is formed on the structure shown in FIG. 3D. The third insulating layer is then anisotropically etched to form spacers 40 on the sidewalls of the spacers 37'. In some embodiments, the third insulating layer comprises the same material as the second insulating layer 37 because the spacers 40 and 37' may be removed as part of the same etching process. For example, the spacers 40 and 37' may both comprise silicon oxide.

Referring now to FIG. 4A, the lower pad layer 38 is etched to a predetermined depth using the spacers 40 as an etching mask, which increases the surface area of the lower pad layer 38'. The spacers 40 and 37' are then removed using dry or wet etching, and an upper conductive layer 39 is formed by filling the space defined by the first insulating layer 36' left at each sidewall of the gate pattern 35 and the lower pad layer 38' with a conductive material. The upper conductive layer 39 and an upper interconnection layer (not shown) may be formed using methods discussed above.

Referring now to FIG. 4B, the recessed region formed in the upper surface of the lower pad layer 38' increases the contact area between the lower pad layer 38' and the upper conductive layer 39. As a result, contact resistance may be reduced.

Figure 5A:
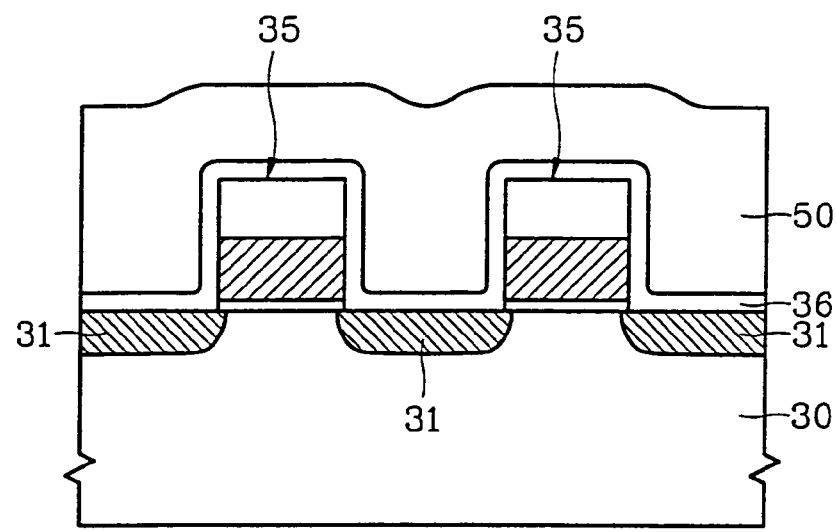
Figure 5B:
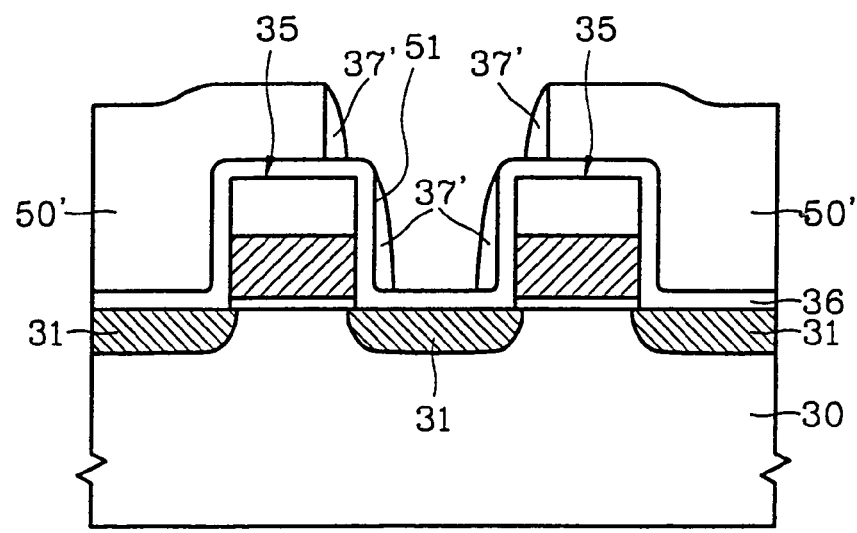
Figure 5C:
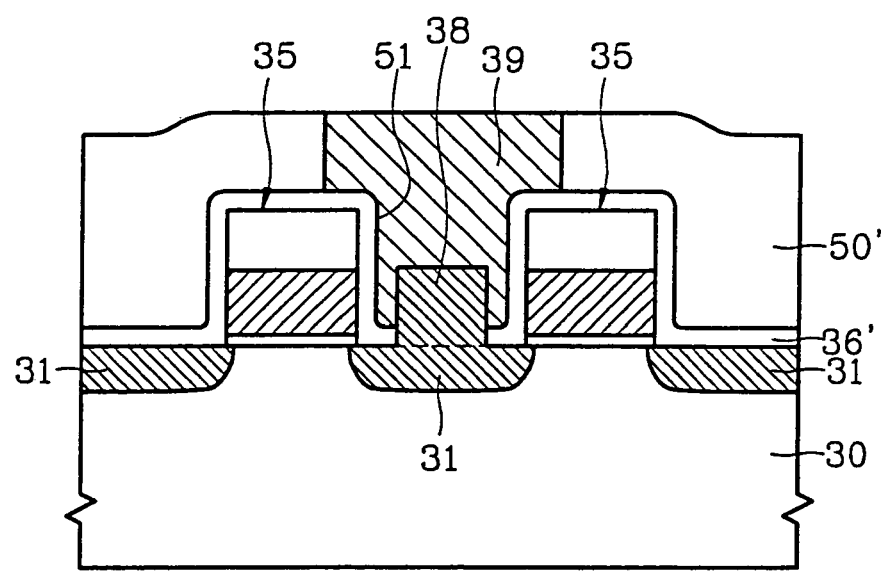

FIGS. 5A through 5C are cross-sectional views that illustrate methods of forming a contact structure in accordance with other embodiments of the present invention. A plurality of gate patterns and a source/drain region, such as those shown in FIG. 3A are formed. As described with reference to FIG. 3B, the first insulating layer 36 is formed on the substrate 30 and the gate pattern 35. Next, as illustrated in FIG. 5A, an interlayer insulating layer 50, which may comprise silicon oxide, is formed on the first insulating layer 36.

In memory devices in which the same patterns are repeatedly formed, bit line contact pads or capacitor lower electrode contact pads may be formed between adjacent gate patterns. Thus, there may be no need to form an interlayer insulating layer, such as the interlayer insulating layer 50 of FIG. 5A, in a memory device. In non-memory devices or in peripheral circuits in which a substrate contact is not formed at every region between adjacent gate patterns, a contact hole may be formed by etching a desired portion of the interlayer insulating layer 50.

Referring now FIG. 5B, a contact hole 51 is formed, which defines an area for a substrate contact, by etching the interlayer insulating layer 50' and exposing the first insulating layer 36 between the gate patterns 35. The contact hole 51 may be formed by etching the interlayer insulating layer 50' so that the contact hole 51 is self-aligned by the first insulating layer 36. The etching mask (not shown) is then removed and, as described with reference to FIGS. 3B and 3C, a second insulating layer is deposited. Then, the second insulating layer is anisotropically etched to form the second insulating layer spacers 37'.

Next, the first insulating layer 36 is etched using the interlayer insulating layer 50' and the second insulating layer spacers 37' as a mask, thereby exposing the source/drain region 31. As described with reference to FIGS. 3D and 3E, the lower pad layer 38 and the upper conductive layer 39 are formed, which results in the structure illustrated in FIG. 5C. As described above, an upper interconnection layer (not shown) may be formed on the upper conductive layer 39 to complete the formation of a contact structure.

Similar to other embodiments described with reference to FIGS. 4A and 4B, the lower pad layer 38 of FIG. 5C may have a recessed region formed in the middle of its top surface. Therefore, it is possible to form a contact structure having a lower pad layer 38 whose surface area is increased because there is a recessed region in its top surface.

As described above, according to the present invention, an epitaxially-grown layer may engage a contact pad on both an upper surface and a sidewall surface thereof so as to increase the contact area between a source/drain region and the contact pad without lowering the integration density. As a result, the contact resistance may be reduced. Also, an insulating layer may be formed at the sidewalls of a gate pattern. The insulating layer may have a bottom portion that extends over the substrate to prevent a contact pad (e.g., an upper conductive layer) from directly contacting a source/drain region. Therefore, even if the contact pad comprises a metal or polycrystalline silicon doped with a high concentration of impurities, contact resistance may be reduced without changing the characteristics of the device.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. An integrated circuit device, comprising:
   a substrate having a source region and a drain region formed therein;
   a gate pattern disposed on the substrate between the source region and the drain region;
   a lower pad layer disposed on at least one of the source region and the drain region that comprises a same crystalline structure as the substrate;
   a conductive layer disposed on an upper surface of the lower pad layer, opposite the substrate, and extending down a sidewall of the lower pad layer such that at least a portion of the conductive layer is disposed between the lower pad layer and the gate pattern; and
   an insulating layer disposed between the gate pattern and both the lower pad layer and the conductive layer, and further disposed between the conductive layer and the substrate.

2. The integrated circuit device of claim 1, wherein the insulating layer extends on to at least a portion of the at least one of the source region and the drain region.

3. The integrated circuit device of claim 1, wherein the lower pad layer has a recessed region in the upper surface thereof opposite the substrate.

4. The integrated circuit device of claim 1, further comprising:
   an interlayer insulating layer disposed on at least a portion of the gate pattern adjacent to the conductive layer.

5. The integrated circuit device of claim 1, wherein the insulating layer comprises silicon nitride (SiN).

6. The integrated circuit device of claim 1, wherein the conductive layer comprises a material selected from the group consisting of impurity doped polycrystalline silicon, titanium nitride (TiN), and tungsten (W).

7. A contact structure, which connects a source/drain region of a substrate between two gate patterns isolated from each other at a predetermined distance to an upper conductive layer comprising:
- an insulating layer, which is formed at the sidewalls of each of the gate patterns, has a bottom portion extending over the substrate to a predetermined length and exposes a portion of the source/drain region of the substrate between the two gate patterns;
- a lower pad layer, which is formed of the same material as the substrate at the exposed source/drain region to be thicker than the insulating layer by epitaxial growth and has a sidewall isolated from the sidewall of the insulating layer; and
- an upper conductive layer, which is formed of a conductive material filling the space between the two gate patterns, defined by the insulating layer and the lower pad layer.

8. The contact structure of claim 7, wherein the lower pad layer has a recessed region at the center of its top surface.

9. The contact structure of claim 7, wherein the conductive material forming the upper conductive layer is polycrystalline silicon on which a high concentration of impurities are doped.

10. The contact structure of claim 7, wherein the conductive material forming the upper conductive layer is metal.

11. The contact structure of claim 10, further comprising a barrier layer formed between the lower pad layer and the upper conductive layer.

12. A semiconductor device comprising:
- a semiconductor substrate at which a source/drain region is formed;
- a pair of gate patterns formed on the substrate on adjacent sides of the source/drain region, respectively;
- an insulating layer formed at the sidewalls of the gate patterns, having a bottom side, which extends over the substrate and exposing a portion of the source/drain region of the substrate;
- a lower pad layer which is formed to be thicker than the insulating layer on the surface of the exposed source/drain region by epitaxially growing the same material as the substrate and has a sidewall isolated from the sidewall of the insulating layer; and
- an upper conductive layer which is formed of a conductive material filling the space between the gate patterns, defined by the insulating layer and the lower pad layer.

* * * * *